US010134311B2

United States Patent

(12) United States Patent
Gilbert

(10) Patent No.: US 10,134,311 B2
(45) Date of Patent: Nov. 20, 2018

(54) ELECTRONIC DISPLAY BOARD, SYSTEM AND METHOD ASSOCIATED THEREWITH

(71) Applicant: ERGYLINK, Levallois Perret (FR)

(72) Inventor: Jerome Gilbert, Levallois Perret (FR)

(73) Assignee: ERGYLINK, Levallois Perret (FR)

( * ) Notice: Subject to any disclaimer, the term of this patent is extended or adjusted under 35 U.S.C. 154(b) by 0 days.

(21) Appl. No.: 15/572,273

(22) PCT Filed: May 4, 2016

(86) PCT No.: PCT/IB2016/052531
§ 371 (c)(1),
(2) Date: Nov. 9, 2017

(87) PCT Pub. No.: WO2016/181257
PCT Pub. Date: Nov. 17, 2016

(65) Prior Publication Data

US 2018/0061285 A1 Mar. 1, 2018

Related U.S. Application Data

(60) Provisional application No. 62/162,884, filed on May 18, 2015.

(30) Foreign Application Priority Data

May 12, 2015 (FR) ...................................... 15 00990

(51) Int. Cl.
*G09F 15/00* (2006.01)
*H05K 5/00* (2006.01)
*G09F 27/00* (2006.01)

(52) U.S. Cl.
CPC ......... *G09F 15/005* (2013.01); *H05K 5/0017* (2013.01); *G09F 27/005* (2013.01); *G09F 27/007* (2013.01); *G09F 2027/001* (2013.01)

(58) Field of Classification Search
CPC combination set(s) only.
See application file for complete search history.

(56) References Cited

U.S. PATENT DOCUMENTS

2003/0004805 A1* 1/2003 Vaitekunas ............... G06F 3/14 705/14.61
2012/0146906 A1* 6/2012 Song ...................... G06Q 30/02 345/158

(Continued)

FOREIGN PATENT DOCUMENTS

CN 101 894 508 A 11/2010
CN 103 456 254 A 12/2013

(Continued)

OTHER PUBLICATIONS

International Search Report, dated Jun. 17, 2016, from corresponding PCT/IB2016/052531 application.

*Primary Examiner* — Lisa Lea Edmonds
(74) *Attorney, Agent, or Firm* — Young & Thompson

(57) ABSTRACT

Disclosed is to an electronic display board to enable a plurality of people to take cognizance of at least one displayable item of information available in digital form in places open to the public. The electronic board includes a box having a flat shape suitable for use as a display board, at least one information processing subassembly including at least one microprocessor, at least one memory able to store at least temporarily an application program, at least one memory able to store data connected with at least one digital content to be displayed, at least one display subassembly, and at least one electrical power source. Also disclosed is a system including at least one electronic display board and a method using at least one electronic display board.

17 Claims, 7 Drawing Sheets

(56) References Cited

U.S. PATENT DOCUMENTS

| | | | | |
|---|---|---|---|---|
| 2013/0257235 | A1* | 10/2013 | Haliburton | H05K 5/0017 312/7.2 |
| 2015/0298490 | A1* | 10/2015 | Takechi | B43L 1/04 361/679.01 |
| 2016/0379492 | A1* | 12/2016 | Roy | G08G 1/09 340/907 |
| 2017/0290175 | A1* | 10/2017 | Malik | H05K 5/0017 |
| 2017/0347467 | A1* | 11/2017 | Min | H05K 5/0247 |
| 2018/0033259 | A1* | 2/2018 | Cummings | G08B 5/006 |
| 2018/0049330 | A1* | 2/2018 | Malik | H05K 5/0017 |

FOREIGN PATENT DOCUMENTS

| | | | |
|---|---|---|---|
| CN | 204 288 753 | U | 4/2015 |
| FR | 2 821 199 | A1 | 8/2002 |
| JP | 2009 080442 | A | 4/2009 |
| JP | 2012 173545 | A | 9/2012 |
| WO | 02/25624 | A1 | 3/2002 |

* cited by examiner

ELECTRONIC DISPLAY BOARD, SYSTEM AND METHOD ASSOCIATED THEREWITH

TECHNICAL FIELD

The field of the invention is electronic display terminals.

PRIOR ART

Display boards in collective places are known, in particular in order to satisfy the legal or regulatory constraints of mandatory display in order to inform an audience of information of a general interest. These are most often cork panels on which papers are thumbtacked. This is all the more surprising when it is observed that the dematerialization of information has long since been a reality in many other sectors of activity, in particular for document management, yet nothing serious to our knowledge has been done in the field of dematerializing the displaying of information in public and private collective places. Conventional means of displaying create problems in terms of administering updates to the displayed documents and in terms of attractiveness for the targeted public which is detrimental to achieving the objectives of a display in terms of consultation frequency.

DISCLOSURE OF THE INVENTION

The purpose of this invention is to overcome at least partially the problems mentioned hereinabove by proposing an electronic display board to enable a plurality of people to take cognizance of at least one displayable item of information provided in digital form in places open to an audience. The electronic display board according to the invention being able to advantageously supplement display boards of papers, even replace them in most cases where the persons in charge have to make information of a nature that may or may not be mandatory available to an audience.

The electronic display board according to the invention comprises:

A casing having a flat shape, suitable for use as a display board. It is provided that the front face of the casing comprises a preponderant display surface, for example of which the surface is greater than 50% of the total surface of the front face of the casing. The casing is arranged to be used in vertical position, for example fixed to a wall, suspended from a ceiling, placed on a frame etc. It is provided in certain alternative embodiments that the display surface of the board comprises a protection surface that is transparent to visible light placed in front of the display subassembly itself. This protection surface is advantageously made from a material and/or treated to increase its resistance to mechanical or thermal shock and to scratches. This can for example be a borosilicate glass of the "pyrex" type or an alkali aluminosilicate glass of the "Gorilla" type (registered trademarks of Corning Inc.). This can also be a hard transparent plastic material such as polycarbonate and advantageously treated to increase its resistance to scratches. Other alternative embodiments of the electronic display board directly expose the external surface of the display subassembly when the latter has sufficient characteristics of robustness. Other alternatives of display surfaces are also provided for display subassemblies based on projection solutions placed in front of or placed behind the display surface of the board.

The casing is furthermore provided to receive functional components of the electronic board. Such components are:

at least one information processing subassembly comprising at least one microprocessor able to run a program connected with the display of at least one item of digital information, said program being stored at least temporarily in a memory. With said memory being for example a volatile memory of the RAM type comprised in a SoC (System on a Chip), with the SoC also comprising the at least one microprocessor, or a RAM external to the electronic component containing the at least one microprocessor or a non-volatile memory such as for example one or several FERAM, MRAM, FLASH, EEPROM, SRAM memories powered by an autonomous energy source such as a lithium battery in the absence of the main power source, with this backup power source being advantageously shared with a real-time clock where applicable.

Said program connected with the management of the display of digital information content, is in certain alternative embodiments an embedded software loaded into a non-volatile memory during the manufacture of the board according to the invention or afterwards via a removable memory medium such as a flash memory card such as a so-called "SD" standard card or the equivalent, a specific removable cartridge that contains a memory, a USB key etc.

In other alternatives this is an application software installed in the environment of an operating system run by the at least one information processing subassembly, possibly on the operating location of the electronic display board. In other alternatives this is a software made available to the electronic display board by a server and run locally in the framework of a higher level program of the web browser type implemented in the at least one information processing subassembly of the board. In yet other alternative embodiments provided wherein the program connected with the display of at least one item of digital information is entirely or partially run remotely in a server continuously connected to the at least one information processing subassembly by the intermediary of at least one network.

The at least one information processing subassembly further comprises at least one memory able to store data connected with the at least one item of digital information to be displayed. It is provided that the at least one item of digital information to be displayed represents information intended to be displayed at determined locations of the display surface of the board according to the invention. It is also provided that the at least one item of digital information to be displayed represents digital documents to be displayed, according to a suitable standard such as "Portable Document Format" (PDF), XPS etc., possibly including metadata or possibly being associated with associated supplemental external data. It is also provided that said data connected with the at least one item of digital information to be displayed is in fact web addresses, for example URLs, pointing to the digital information to be displayed in a server. This alternative of the invention, although requiring a connection to a network in order to be able to access new digital information to be displayed, offers the advantage of being able to store the equivalent of a very large number of digital documents, possible encoded in very high resolution, in a memory with a relatively small capacity. Alternative embodiments are provided wherein said program and the data connected with the at least one item of digital information to be displayed are stored in the same physical memory of the information processing subassembly.

at least one electronic display subassembly, for example able to be displayed on the scale of 1 at least one facsimile of a document of a page in the standard A4 format or in the American standard format referred to as "US Letter". According to alternative embodiments provided, the at least one display subassembly is for example an LCD or OLED screen. It is provided in the preferred alternative embodiments of the invention that the at least one display subassembly is based on a monochrome or polychrome bistable display technology, for example of the "electronic paper" or "electronic ink" type based for example on electrophoresis or on bistable liquid crystals, which does not require any energy in order to maintain the display of the image and which furthermore offers a very wide viewing angle horizontally as well as vertically which is particularly advantageous for a display board. Alternative embodiments are also provided wherein the at least one display subassembly uses projection techniques from the front of the display surface or from the rear as well as 3D display alternatives that can be used without glasses. It is provided that the at least one display subassembly also is able to display at least one item of digital information that is entirely generated by the at least one information processing subassembly of the board according to the invention and/or which is at least partially received from an external source via a connection to a PAN, LAN or WAN network (respectively Personal Area Network, Local Area Network and Wide Area Network), for example respectively information received from a smartphone via Bluetooth, received from a workstation or from an external server via a connection to a local WiFi or Ethernet network, received from a workstation or from an external server via a modem that can be connected to a 3G or next generation wireless cellular network. Such information is for example the time and the date, a user guide, a menu for the installer, the logo of the entity that is operating the board, messages intended for collective information, the graphic presentation displayed that comprises for example zones that delimit categories of information that are clearly identified by alphanumeric and or graphic indications, virtual buttons or any other displayable information which is connected with the ergonomics of the functions of the electronic board etc. It is provided in certain alternative embodiments that the display of information, for example that which is connected with the ergonomics of the functions of the electronic board is carried out through superimposing or as temporary insertion of another item of information displayed, for example a document, with possibly a management of the transparency of the superimposed image in relation to the background image, according to the possibilities of the technology used in the display subassembly of the board.

at least one electrical power source used at least temporarily. In light of a use that requires a display for a long duration and even permanently, that the updating frequency of the displayed images is low and even very low, the joint usage of bistable display techniques and low-power electronic information-processing solutions coming from the world of battery-powered portable terminals limits the energy requirements. Alternatives of the invention provide for the electrical power supply of the board via a connection to a wired network, for example via an Ethernet connection called "Power Over Ethernet". More conventional alternatives are also planned wherein the power supply is provided via a direct connection to the electrical network of the onboard electronics in the board which then comprise a low-voltage power supply subassembly of low thickness or via a transformer or an external converter powering the board with low voltage, for example with a voltage from 5 to 48V DC.

It is provided in certain alternatives that the at least one electrical power source captures the energy required for operation of the board in its environment. The preferred use of passive screen technologies that require external lighting in order to view the displayed images, it makes it possible to simultaneously power the board with energy. This for example by using photovoltaic cells and/or an additional transparent layer that generates electrical energy through the photovoltaic effect superimposed on the screen. In other alternative embodiments, these are slabs or mats that transform the stepping movements of persons circulating in front of the board that supply it with energy. It is also planned to use the energy produced by the pedaling of a user on a stationary bicycle placed in front of the board or by actuating a crank or a lever that drives a generator.

The invention provides that the at least one information processing subassembly also comprises at least one source of time information. This is for example a clock/calendar of which the electrical power supply is backed up by autonomous means of a power supply such as a battery, a storage battery or a supercapacitor. It is provided that advantageously said source of time information is hardware and/or software means for receiving time reference information diffused or transmitted by wired or wireless means. For example an integrated resource, or peripheral, of the at least one information processing subassembly providing the receiving and the decoding of time information such as DCF 77 in continental Europe, a receiver of time signals extracted from frames encoded with the radio broadcast standard RDS or signals diffused by satellites of positioning systems such as GPS and/or GALILEO. It is also provided that said source of time information is an adaptor, a receiver or a modem, able to receive time information distributed by a local company network or by a telecommunication network to which the device according to the invention is connected. Or time information distributed to the electronic board by the lighting system of the room wherein it is installed by a suitable modulation of the light. If the at least one information processing subassembly comprises an onboard real-time clock, it is also provided that it is automatically set to the time and to the data coming from a reference time information source where applicable.

It is provided that the electronic board according to the invention further comprises a surface for displaying printed documents. The zone for displaying printed documents is for example comprised of a single material of a sandwich of materials with a thickness that is sufficient to allow for an easy fastening of printed documents by means of pins or thumbtacks while still offering an aptitude to mask the holes left by prior fastenings via its surface condition and/or via the qualities of elasticity that tend to close the holes from prior fastenings. For example a material such as cork which is conventionally used for this function is suitable or a composite formed from a thickness of dense synthetic foam and from an external skin able to mask the holes left by prior fastenings. Other fastening solutions by points are for example stacks of blades of which the edge is perpendicular to the surface of the board and which are pressed against one another with a certain elasticity due to their shape and the nature of the material that they are comprised of or by a pressure exerted on the stack of blades via a spring effect. All other solutions for fastening papers onto a support are also suitable, for example by magnets on a ferromagnetic surface, by mechanical solutions that pinch the paper, by maintaining printed documents between a surface that forms a bottom and a plate made from a transparent material, by electrostatic adhesion of documents on the surface of the board, by repositionable gluing or not etc.

It is indeed advantageous to supplement the electronic means of displaying dematerialized information of the board according to the invention with one or several coplanar surfaces dedicated to the displaying of printed documents in order for example to satisfy certain legal obligations, to reserve the electronic display surface, more expensive, to the display of information that is likely to be updated frequently, with the conventional display of printed documents being more suitable for presenting information that does not change or that does not change very often such as for example safety instructions intended for the occupants of a building or internal regulations. The mixed display solution provided as such also responds to the need for display boards of which the minimum size imposed by regulations or by law is greater than the surface of the electronic display screens that are industrially available at an acceptable cost.

It is provided that the electronic board according to the invention further comprises a surface for writing, for example a white smooth surface for writing with dry wipe pens.

The invention provides that the at least one display subassembly is comprised of at least two basic display subassemblies juxtaposed edge to edge over at least one of their respective sides forming a global display subassembly of a useful surface equal to the sum of the useful surfaces of the at least two basic display subassemblies. The useful surfaces are those that include pixels. It is indeed advantageous, even mandatory in certain cases, in order to create electronic boards according to the invention that offer large display surfaces, to juxtapose several basic display subassemblies of smaller dimensions. It is as such provided to use formats of basic screens used in volume productions accessible in advantageous economic conditions, for example bistable screens of about fifteen or of about twenty centimeters diagonal used in devices of the e-reader type. It is provided to mechanically assemble the basic screens edge to edge by minimizing as much as possible the width of the lines and/or of the columns of pixels lost between each basic screen. Solutions will advantageously be implemented in order to reduce the columns and/or the rows of pixels lost at the interfaces between adjacent basic screens by using for example asymmetrical formats that have active pixels to the end of the substrate on one or on two edges. Most screen technologies in fact require a non-useful surface for routing electrodes to the pixels and/or for receiving electronic chips for controlling pixels and/or for receiving the components of an electrical interface. The invention provides to use basic screens wherein the non-useful surface, where applicable, is arranged asymmetrically over one or several of their sides external to the composite screen formed as such in order to minimize the difference between the columns and/or the rows of pixels of the sides juxtaposed edge to edge at the internal borders of the composite screen.

The invention comprises a software subassembly that manages the display, where applicable by distributing the information to be displayed on the plurality of basic display subassemblies in a suitable manner in order to create a "logic screen" that has a size that is greater than that of a "physical" basic display subassembly that comprises it. In certain alternative embodiments, it is provided that the display management software distributes the information to be displayed in such a way that each item of information that forms a homogeneous whole is fully displayed in a given "physical" display subassembly in order to prevent the unpleasant effect of columns and/or of lines without pixels from appearing between two adjacent display subassemblies.

The invention provides that the at least one information processing subassembly is a digital tablet, a phablet, a smartphone, an e-reader or a modular computer. The invention provides that such a complete device in its own original casing is integrated into the casing of the board. It is also provided that an essential technical subassembly of such a device such as a printed circuit provided with its electronic components of the "motherboard" type is integrated into the casing of the board according to the invention. More generally the invention provides that the at least one information processing subassembly is at least one standard computing device, or an essential technical subassembly of such a device. This is for example a digital tablet with a tactile screen such as an iPad (registered trademark of Apple Inc.) or an Android tablet (registered trademark of Google Inc.), a smartphone such as an iPhone (registered trademark of Apple Inc.) or an Android smartphone (registered trademark of Google Inc.), a "phablet" i.e. device with a size between a smartphone and digital tablet such as for example the Galaxy Note (registered trademark of Samsung Electronics Co.), a portable computer for example of the PC or Mac (registered trademark of Apple Inc.) type, an industrial modular computer for example in the PC104 standard, a low-cost modular computer electronic card such as the Raspberry Pi (registered trademark of the Raspberry Pi Foundation) or Arduino (registered trademark of Arduino team) etc., with the qualifier as standard meaning that said computing device is not an electronic subassembly designed specifically for the board according to the invention but a technical subassembly designed and manufactured for another application or a generic technical subassembly placed on the market to be used without prejudging the application context.

It is provided that the electronic display board according to the invention further comprises software and/or hardware means in order to force the reinitialization of the at least one information processing subassembly. Indeed, the use of at least one general public electronic device, or of an essential software or hardware subassembly of such a device, as an information processing subassembly exposes the board according to the invention to the risks of rupture in service caused by accidental shutdown of a software resulting in the definitive blocking of the device (a device "crash" in computer jargon). This risk is not acceptable in the framework of a professional use that generally requires operation 24/7. This risk is also problematic when the board according to the invention is used to satisfy a legal obligation such as the obligation of making information available to an audience for a determined time. It is provided to reduce this risk for example by periodically forcing the reinitialization of the at least one standard computer subassembly by means of a specific software or of a solution of the long-duration timer type created for example as hard-wired logic. Such a specific software is implemented more preferably at the lowest level of the software stack of the device, for example on the operating system, and even on the BIOS if possible, in such a way that it is highly unlikely that this software is affected by a malfunction at the application level. A refinement based on the principle of the "watchdog" known to electronics engineers is also planned. An application process at the same hierarchical level as the application program implementing the functionalities of the device according to the invention, or one of the functions of the application program, periodically reinitializes a timer in order to prevent it from reaching the term as long as the program is running normally. When for one reason or another reinitialization of the timer is no longer carried out, the timer reaches the term and causes a reinitialization of the at least one computer subassembly. It is also provided that the timer and/or the controlling of the reinitializing of the at least one standard computer subassembly is implemented in the form of an electronic subassembly external to the at least one standard computer subassembly. It is also provided that the reinitializing of the at least one standard computer subassembly is done via a mechanical press by means of a suitable actuator such as a solenoid with a plunger core on a specific button (a "reset" button) or on a combination of buttons of the device in the case where it is not equipped with a specific button. For example a device that implements the iOS operating system (registered trademark of Apple Inc.) is reinitialized by pressing the "On/Standby" button and the main button for at least ten seconds. In certain alternative embodiments, it is provided to act on the buttons involved in the reinitializing not mechanically but electrically. This alternative is based on the adding of electrical conductors mounted in parallel on the contacts of the concerned buttons of the device in order to ensure a functional connection with an electronic subassembly for external control based for example on an interface that uses at least one optocoupler or an electromagnetic relay. In other alternative embodiments of the device according to the invention which are connected to a network, it is provided that a supervisor or that a remote server remotely controls the reinitialization of the at least one standard computer subassembly by any means such as described hereinabove when a device remains silent over the network beyond a predetermined time. Indeed, one of the frequent causes of an absence of transmission of information when the at least one standard computer subassembly is a general public device, outside of a hardware breakdown requiring physical intervention, is a definitive blocking of the software requiring a reinitializing of the device.

It is further provided that the at least one electronic display subassembly of the electronic display board according to the invention is tactile. This is for example carried out by using one or several display modules that are natively tactile or by adding a surface that has been rendered tactile. With the latter being transparent when it is placed in front of a screen, able to restore an image projected in the case of a display via projection or using sensors at the periphery of the screen, the capturing and the analyzing of images of movements of the hand of the user etc.

It is also provided that the electronic display board according to the invention further comprises means that allow the user to interact with the board without touching the display surface. For example means that make it possible to render tactile the outer surface of a material placed at the periphery of the at least one means of electronic display. This entails for example functionalizing at least one edge of the display surface in order to offer users one or several tactile interaction zones in order for example to scroll the content displayed within a more vast set of displayable content, in order to zoom or access annexed functions. This includes for example electrodes placed under the surface of the frame and which use technical solutions referred to as capacitive keys. Advantageously, the zone or zones that have been rendered tactile will be the object of suitable marking so that the user locates them and easily understands the functions associated with these means of interacting with the board. In certain alternatives, the invention provides to implement means that allow the user to interact with the board without contact with the display surface or with its frame. It is such provided to place proximity sensors that react to the approach of hands before they come into contact with a surface. It is also planned to use a camera associated with software that recognizes gestures or eye movements and/or of other parts of the face of the user in order to allow for contactless interactions.

It is provided that the electronic display board according to the invention further comprises means for choosing the language wherein at least one portion of the information displayed is presented to the reader. This entails for example providing additional comfort, a securing of the understanding of the information and of the enlarging of the audience to persons that do not understand the main written language or do not understand it very well, for example in locations such as airports, train stations, onboard aircraft or boats, in embassies, museums, stores etc. This is for example the choice of the written and/or oral language used for the interaction between the user and the board. This is also the language wherein the content is made available to the user. This refinement is particularly useful when the official translation is rendered necessary so that the display produces legal effects. It is also planned, when the original language of a displayed document is imposed to produce legal effects, that a translation into another language be proposed to the user by a display or by an additional audio playback in the language of the interaction.

It is provided that the electronic display board according to the invention further comprises means for orally restoring at least one portion of the information displayed in the display language and/or in a different language. This is for example means for restoring onboard audio using a speaker or headphones that can be connected on the board. In a preferred alternative embodiment, the user of the board accesses an oral restitution of the document of interest by using an external terminal and a code associated with the displayed document. A simple telephone can be used by calling a voice server associated with the board or with the displayed document. Direct access to the content of interest with a smartphone by "scanning" an alphanumeric code or a graphics code such as a barcode or a "QR code" is also planned. It is provided to restore the content of interest, after translation into another language where applicable, on the screen of the terminal or by the audio restitution chain, the latter directly by generic means of the terminal or via an application specific to the board according to the invention.

It is provided that the electronic display board according to the invention further comprises a tactile restitution interface of at least one portion of the information displayed. This is for example an electromagnetic actuator allowing for the reading of digital information in Braille for blind and partially-sighted persons. This refinement is particularly important in the case of displaying information connected with the rights or the safety of persons.

It is provided that the electronic display board according to the invention further comprises means for receiving and/or for transmitting data. This is at least a connection to a one- or two-directional communication network that uses wired means such as Ethernet, via optical fiber, via power-line communication, or via wireless means such as a connection to an external cellular radio infrastructure, or a radio connection to a public or private access point by short-range radio means such as WiFi or Bluetooth, or via conducted or radiated optoelectronic means that use infrared.

The invention also provides that the at least one connection to a communication network is a receiver arranged to extract data transmitted by modulation of a luminous flux coming from a visible light source that can be modulated at a high frequency for example with a base of one or several LEDs or fluorescent sources. It is advantageously provided that the electronic board according to the invention, if it is equipped with at least one passive display subassembly that has to be illuminated so that the information displayed can be read, also comprises a receiver that can extract data contained in the light received. It is even further advantageous that photovoltaic cells provide the power supply of the electronic board in such a way that the exposure to at least one luminous flux simultaneously provides the lighting of the screen, the transmission of the data of the content to be displayed and the supplying with energy of the electronic board.

It is provided that the electronic display board according to the invention further comprises software and/or hardware means in order to form a meshed network of boards according to the invention in order to increase the range of the at least one connection to a communication network by using each board as a relay in order to establish a connection with a resource such as a network access point which is not within direct range of one or several points of the meshed network formed as such.

It is also provided that the electronic display board according to the invention further comprises software and/or hardware means for encrypting the information transmitted between a remote source of information and the display device. The use of means for encrypting/decrypting the information is particular useful in order to prevent a network of electronic display boards according to the invention from being hacked and used by malicious third parties to display inappropriate and unauthorized information.

It is also provided that the electronic display board according to the invention further comprises software and/or hardware means for authenticating the source of the information received. These means participate in the security of the system, for example in order to display only documents of which the source is authenticated and/or in order to ensure the traceability thereof. An electronic certificate system can advantageously be used to authenticate the source of the information to be displayed and to transmit all or part of the encryption keys used for the encryption/decryption of the information to be displayed.

It is provided that the electronic display board according to the invention further comprises means for receiving, storing and managing the rights pertaining to all or part of the information displayed or to be displayed. The management of the rights associated with the display of digital content according to the invention is particularly important in the so-called contexts of legal display where the making available of information to be displayed to an audience is governed by laws or regulations. It is provided that the data that defines the rights associated with a digital content to be displayed on the electronic board according to the invention is transmitted to the board in the form of a file that is separate from the one of the digital content to be displayed. It is also provided that the rights associated with each digital content are supplied to the board in the form of metadata in the same file as that which contains the data of the dematerialized document to be displayed. It is provided that the electronic board according to the invention receives the information of the documents to be displayed and/or the data of the rights associated with the display by the intermediary of a removable physical memory such as a memory card, a USB key etc. It is also provided that this information is received by the electronic board via wired or wireless means of transmission of all types.

The invention provides that said rights include the date of publication of an item of information and/or the duration for which an item of information must remain displayed and/or the date on which the display of an item of information must stop. In an alternative embodiment that is preferred in that it is autonomous, the rights are managed locally by the board according to the invention using the real-time stamping information that it has locally. Other alternative embodiments of the invention are provided in which the rights are managed remotely, with the board then acting as an offset display terminal in the framework of a system where the rights associated with the displays are managed remotely outside of the electronic boards. It is also provided that the rights associated with the content to be displayed are managed locally in the board but that at any time it is possible to force the display or the removal of a determined document, by sending a suitable remote command to the at least one board concerned.

The invention also provides that said rights include an item of information relating to a categorizing of the information to be displayed according to the content thereof and/or according to the issuer thereof. This advantageous characteristic of the invention can be used in particular in the framework of a subaddressing of dedicated display zones on the global display surface of the board where information of the same category is grouped together. For example, in a board according to the invention intended to be used in companies for mandatory display, specific display zones within the same board, or a plurality of boards entirely dedicated to a determined category of information, are allocated for example to trade union information, to information from the human resources department, to information connected with health and safety, to company cafeteria menus etc.

For use in town halls for example, the subaddressing makes it possible to automatically gather together homogeneous documents in spaces reserved within the same board, or in dedicated boards, for information on the building permits granted, with the information coming from the prefecture, the decisions of the mayor, civil status, environmental information etc.

It is provided that the electronic display board according to the invention further comprises at least one means for taking the geographical location of the board into account. This entails for example allowing for a subaddressing of the display means according to the invention according to the location where they are physically installed. This also entails making it possible to remotely know at least one item of information associated with the display location in order for example to produce statistics or audience measurements associated with the locations of the boards according to the invention.

It is provided that the location of the boards is obtained by the intermediary of a database that associates the addresses of the boards in a communication network with the locations where the boards are physically installed. It is also planned to use software and/or hardware means to geo-locate the electronic boards. It is also provided that the at least one item of information associated with the display location encodes the type of location, for example the hall of a town hall, a zone reserved for legal display in public establishments or in companies, a display zone in public transport etc.

The invention provides that at least one electronic display means makes it possible to display all or part of said information in a persistent manner in the absence of a supply of electrical energy. This involves for example using persistent display technologies referred to as electronic ink or bistable liquid crystals.

It is provided that the electronic display board according to the invention further comprises at least one sensor. This is for example a passive infrared presence detector, a presence detector via infrared reflection, ultrasound or electromagnetic waves, an ambient luminosity detector in order to adapt the viewing conditions of the display means such as backlighting, or the emission of light in emissive display solutions or the level of ambient lighting for passive display solutions such as those referred to as digital ink or electronic paper. This also involves sensors of fixed images or video, biometric sensors or an RFID tag or badge reader, for example for identifying persons who are viewing the content. It is also provided that the board comprises at least one sensor for detecting violations to its physical integrity and/or for detecting intrusions in the premises where it is installed. It is provided that the corresponding information is used by a local alarm, for example by activating a high acoustical power buzzer integrated into the board and/or by the transmission of an alarm to the remote means of supervision or monitoring.

The invention provides that the at least one sensor is used to detect the presence of persons in a situation to view the at least one item of information displayed. This characteristics allows for example, intelligent management of the electrical consumption of the board such as an automatic exiting of a standby mode when a person is detected as being in a situation to view, and a maintaining of the electronic board active as long as at least one person is detected as being in a situation to view the content displayed. Another use is for example the production of statistics concerning the usage frequency of the board.

It is provided that the electronic display board according to the invention further comprises software and/or hardware means for managing the working time of the personnel. It is indeed advantageous in a context of using the board in the place of work to include therein realized work time collection terminal functions in that the persons concerned are naturally exposed to the information displayed by the electronic board according to the invention at least once a day without any additional effort or loss of time. As such it is provided to include in is the surface of the board for example an optical badge reader, a contact or contactless chip card reader, an NFC tag reader, a reader that is compatible with the onboard NFC function in smartphones etc.

It is provided that the electronic display board according to the invention further comprises software and/or hardware means for selectively displaying information according to the identity or a membership category of the reader. It is provided to recognize the reader or at least one item of information connected with one of his membership categories by entering a code, presenting a badge on an optical reader or on a contact or contactless chip card reader, presenting an object that can be identified by a suitable RFID reader, by a camera and facial recognition software, by means of a biometric information reader etc.

It is provided that the electronic display board according to the invention further comprises that the same screen be arranged to display information coming from separate remote sources in dedicated display zones.

The invention also provides that each display zone dedicated to a given source of information is managed as a standard display means for the remote information system that sends the information to it.

It is provided that the electronic display board according to the invention further comprises software and/or hardware means for cooperating with an external system. This is an information system in liaison with the information to be displayed for example in order to "vote" from a plurality of items of information displayed, in order to transmit statistics on the number of persons who have been exposed to the display, in order to cooperate with a technical management system of the building, with a lighting or heating system of the display location, with an alarm system, with a system of information connected with the management of payroll and/or with the management of the personnel and/or with the scheduling of the work, in order to alert remote means of management or supervision in case of a violation of the integrity of the device or of its fastening, in case of intrusion in the premises where the board is installed outside of the periods when this is authorized etc.

It is provided that the electronic display board according to the invention further comprises at least one display subassembly on its rear face able to allow for a use of the two main surfaces, front and back, of the board. In certain alternative embodiments, the display on the rear face of the casing is identical or of the same nature as the one on the front face, in particular in that it offers a persistence of the display of fixed images in the absence of an electrical power supply. In certain alternatives, the rear face of the casing comprises a display, for example LCD, complementary with that of the front face in that video digital content in color is able to be displayed. This refining of the invention makes it possible for example to install boards according to the invention in the center of a room rather than on walls and to as such use both main faces of the devices. It also makes it possible to use the boards according to the invention, such as described hereinabove on their main face, and to allocate the access to the display means of the other face to another type of operator, for example for advertizing or for the diffusion of institutional information. It is also provided that the display surface of the rear face of the board does not include any electronic display subassembly but at least one non-electronic display means, for example a surface for displaying printed documents, advertizing posters or works of art.

It is provided that the electronic display board according to the invention further comprises a video camera and/or a digital camera turned towards the persons who are viewing the board and/or turned towards a face of the board. This entails for example controlling the operation of a video camera and/or of a digital camera in order to acquire at least one image of the persons who are viewing said information and/or in order to extract therefrom information by using suitable image processing. This entails for example counting the persons who have been exposed to the information displayed, categorizing them according to criteria that can be determined with a good probability of accuracy by image processing and/or by recognition of the characteristics of images associated with the criteria of interest such as the sex, age bracket, ethnic type in countries that authorize the management of this information etc. This also entails for example acquiring an image of all or part of what is displayed on the board, for example of documents printed on paper that are displayed in order to allow for the viewing thereof remotely or the digitizing thereof for archiving.

It is provided that the electronic display board according to the invention further comprises at least one web server function associated with a determined web address. This entails for example allowing remote users to view by means of a standard web browser all or part of the information displayed on the board and/or to access the at least one item of digital information proposed by the board. In a first autonomous alternative embodiment, the electronics of the board according to the invention, or at least one specialized module included in the board, runs one or several software that make it possible to offer functionalities of at least one web server as soon as the board is connected to Internet via a connection to a network of the so-called PAN, LAN or WAN types. In a second embodiment, the board is connected to Internet via a connection to a network of the so-called PAN, LAN or WAN types and it communicates, advantageously in an encrypted manner and authenticated beforehand with one or several software run in remote servers in order to offer the functionalities of at least one web server.

It is provided that the remote user can use all of the types of terminals provided with a standard web browser, with or without the installation beforehand of additional software referred to as a plugin, or all of the types of mobile terminals or computers that can run application software that is specific to the board according to the invention by relying advantageously on standard software components connected with the so-called web technologies.

It is provided to use this functional characteristic of the invention to offer two remote types of access of which the board is the focal point.

A first use aims to allow remote digital content producers to publish it and/or to make it accessible to an audience. In certain alternative embodiments, portions that are visually separated and identifiable as such on the surface of the board are managed by a web server dedicated to each one of them run in the board or in a remote server. In other alternatives, the separation of the portions is only logical in the management of the global display space of the board, or the separation is partially or entirely physical through the use of separated display means managed by shared electronics and software. In other alternatives, each space of the board associated with a given content producer is associated with a separate module comprising display means and a dedicated hardware and software management subassembly.

A second use of the functionalities of at least one website associated directly or indirectly with the board according to the invention aims to allow persons to remotely consult the content displayed, or which can be displayed, by a board connected to Internet. This technical characteristic is all the more so useful in that the board becomes the place of convergence for information of a various nature and of various origins and/or that the board responds to a legal or regulatory obligation which gives it a reference display function with regards to a given audience. It is provided in alternatives comprising a space dedicated to the display of documents printed on paper, that the board comprises a camera or a digital camera turned towards the board, placed for example at the end of a beam protruding from the upper portion of the frame, in order to acquire the image of the displayed printed documents in order to allow them to be read remotely, in the same way as the natively digital documents that are displayed.

It is provided that said casing having a flat shape suitable for use as a display board is arranged to support standardized modular functional elements. The casing is for example arranged to be able to assemble and in order to maintain in the suitable position modular functional elements of which the unit dimensions allow for the obtaining of several functional combinations for a given board dimension, and/or allow for the obtaining of several board dimensions through the combination of standardized basic technical subassemblies. This is a modular alternative of the invention that makes it possible to realize a plurality of functional alternatives and/or the realization of a plurality of board sizes by the final assembly of a reduced number of models of standard basic functional modules. This alternative responds to an industrial need in the search for efficiency through the increase in the manufactured quantities of a reduced number of technical objects while still offering a large choice of finalized board models and commercial references to the users. The technical characteristics of a modular and standardized design furthermore make possible, if necessary, an optimized industrialization in separate locations, of the manufacture of standard basic functional modules and the final assembly of the boards. As such modules of standardized size are provided, for example according to international standards ISO 216 and 269 which define the standardized paper formats used in most countries according to three series of formats referred to as A, B and C. Many combinations are then possible knowing that a module with size A4 with a "portrait" orientation is equivalent to two modules of size A5 with a "landscape" orientation, that the assembly of two A4 modules with a "portrait" orientation, or of one A4 module with a "portrait" orientation and of 2 A5 modules with a "landscape" orientation, or even 4 A5 modules with a "landscape" orientation form a board of size A3 with a "landscape" orientation. It is provided to use this principle of modularity, entirely or partially, in order to easily realize any pertinent surface of board according to the invention. A "partial" usage of this principle is provided for example in the case of modules that have the technical advantage of having a format of which the width or the height is not the expected multiple. For example for a "100% light" module that comprises photovoltaic cells which provide the electrical power supply of the board and which comprise one-way or two-way means of communication based on the modulation of visible light and/or of infrared radiation. Such a module, naturally in "landscape" orientation and placed in the upper portion of the board will have for example a format of a banner of which the height corresponds to the height of an A5 module with a landscape orientation and the width of an A3 module, or for example respectively A3 and A1, A2 and A0 etc. The same applies for a module of the emissive display banner type, with a scrolling or static text for example. The invention also provides to facilitate the assembly of the modules by providing for the display modules that the "portrait" or "landscape" orientation, as well as where applicable the position of each display module in the flat casing forming the board, gives rise to a manual or automatic configuration of the display management software or softwares of the board as a whole in order to display an overall coherent result. Alternatives implement a step of configuring the layout of the modules in at least one software. Other alternatives detect the absolute or relative orientations and/or positioning of the modules in order to automatically configure the final rendering of the display. This for example through the choice at the time of mounting modules of the connectors used to ensure the electrical continuity of the electrical power supply and/or of the communication between modules, through suitable electrical contacts or through implementing sensors.

In a first alternative embodiment, said flat casing forms a plate that is perforated or not, with advantageously folds at least on the external edges and/or ribs that strengthen its rigidity. The plate formed as such allows for the fastening of the basic modules that comprise the board of which the external surface that can be seen by the end users is rendered coplanar by design, for example via a constant thickness of the modules or via the use of spacers or shims of suitable thickness. The means for fastening modules onto the plate are for example screws that are engaged into the screw thread or in depressions provided in the bottom of the casing of the basic modules which are advantageously made of coated or passivated steel sheet. The screw heads are set into tapered holes or into hollows of a stamping carried out in the plate in such a way that they do not exceed the plane of the rear face of the plate. Holes are advantageously made in the plate forming the bottom of the flat casing of the board in such a way that in light of the standard dimensions of the basic modules and of the location of the screw threads or depressions made in the rear face of their casinges, all of the configurations for the positioning and orientation of the basic modules are provided. In another alternative, the fastening of the basic modules onto the plate is done through the sliding of hooks or tabs made via stamping, partial cutting and folding of the sheet metal forming the casinges of the basic modules in complementary shapes arranged in the plate or reciprocally, with all of the modules after assembly being blocked by one or several screws, pins or by any other element that prevents the detaching of the assembly. It is also provided a peripheral frame that provides mechanical protection for the edge of the board. The frame is particularly useful when external surfaces made of glass are used. The frame, in addition to its functions as a support material for a choice of aesthetic style and the commercial brand of the board, is also functionalized in certain alternatives of the board in order to receive mechanical buttons or buttons and/or tactile interaction zones that use for example electrodes and electronics for managing capacitive tactile interfaces placed under the surface of the frame.

Modules with standardized dimensions for boards are provided according to the invention that offer functionalities of all types, for example monochrome or color display means, whether or not bistable, which may or may not be capable of displaying video and diffusing the corresponding sound, which may or may not integrate the at least one information processing subassembly, work time management modules adapted to contexts of professional use, modules for managing alarms and/or intercoms suitable for contexts of use in halls of buildings or in the reception area, modules for detecting and/or managing fire and/or intrusion alarms, intrusion, modules allowing for the supplying with energy and/or the communication of data through light, communication modules suitable for wired or wireless networks, which may or may not integrate the functionalities of one or several web servers, modules for displaying documents printed on a paper medium, modules that offer a suitable surface for manual marking with suitable felt pens, modules of which the surface is marked via etching, by 3D printing methods, by silkscreen with resistant inks in order to sustainably display for example safety instructions, with the web address making it possible to access the board remotely, a company name etc., display modules that can be read at a relatively long distance, emissive or passive, with fixed or scrolling text, in order in particular to display the time and date, modules of which the only technical function is to fill in an empty space in a modular composition forming a board according to the invention etc.

According to another aspect of the invention, a system for displaying dematerialized information on an electronic display board is provided, characterized in that it comprises:

at least one electronic display board according to the invention that can be connected to a data communication network, for example to a wired or wireless local or long distance network connected to Internet, at least one server that can be connected to a data communication network, able to store and/or manage dematerialized information to be displayed and/or rights associated with the publication thereof. It is provided in alternative embodiments that the at least one server is in the network to which the at least one electronic display board is connected in the framework of an architecture of the "Cloud" type. It is also planned in other alternatives that the at least one server is included in the electronic board according to the invention, at least one network able to allow for data communication between the components of the system.

It is also provided that the system according to the invention further comprises at least one workstation able to allow at least one person to manage the dematerialized information to be displayed and/or the rights associated with the publication thereof through a standard web browser, or through a software of the "plugin" type that is simple to install in a standard web browser, or through a dedicated application software.

According to another aspect of the invention, a method is provided for making written information available to an audience, with the method using at least one electronic display board according to the invention.

The method according to the invention comprises:

A step of selecting at least one digital document proposed in a set of at least one displayable digital document, A step of displaying the at least one selected digital document.

It is provided in a preferred embodiment that these two steps are carried out substantially simultaneously.

It is provided that the display document is displayed on a scale greater than or equal to 0.8 in such a way that, where applicable, pictograms, virtual buttons or any information directly or indirectly related to the functionalities or to the use of the board according to the invention can be displayed simultaneously at the edge of the document.

It is provided that the method further comprises at least one prior step of proposing at least one digital document that can be displayed. It is provided that the step of proposing is carried out according to the most pertinent criterion for a given category of documents, for example in alphabetical order of the name of a person, in increasing or decreasing order of the digital document creation date etc.

It is also provided that the step of selecting content to be displayed is carried out in the logic retained for the presentation of the proposition according to the most pertinent criterion for the document category in question. It is also planned to offer the user tools for searching for a document of interest according to one or several criteria.

A step is for example provided wherein all or part of digital documents that can be displayed in the form of at least one separate element that is characteristic of said document is displayed on the board, for example its title or, if the display is done in a zone of the board that is clearly identifiable as reserved for a given type of document, by the name of the holder, a reference, a date, or by any other information or combination of pertinent information in order to identify a document of interest. All types of ergonomics are provided for the proposition of displayable digital documents, from the total or partial display of lists exclusively formed of alphanumeric characters wherein it is proposed to the user to browse, to sophisticated presentations based on the display of thumbnails of the documents proposed. A provided refinement is the concurrent display of at least one separate element that is characteristic of said document, and/or the enlargement thereof within the thumbnail image displayed, in order to facilitate the identification of the document and the selection thereof. The thumbnails are for example proposed in the form of a carrousel where the document pointed to in the frame of the current selection, can be identified by a suitable graphics effect such as a display in the foreground with a perspective effect, a framing of its thumbnail, an arrow that designates it etc.

It is provided, in the boards according to the invention that have a sufficient display surface, to use a portion of the display surface in order to select the document and to use another portion to display it on the desired scale. As such the browsing in the choices of possible documents automatically leads to the displaying of the document that corresponds to the last current implicit choice. As such the browsing in the displayable documents is intuitive and direct by browsing a catalog without requiring explicit validation of a choice prior to the display of the corresponding document. In boards of which the surface is insufficient for allowing for an implementation of methods for simultaneously selecting and displaying, a step of selecting is provided with explicit validation of the choice of the user in the proposed catalog before the displaying of the corresponding document which is substituted at least partially for the display of the catalog and of the selection interfaces.

It is also provided that the method according to the invention further comprises at least one step of browsing within the at least one selected digital document. This for example when the document contains several pages, or when the document contains more information than the board can legibly display during said step of displaying the at least one selected document, or when the insufficient visual acuity of the reader requires an enlargement of the image which no longer allows for the displaying of the full document in the display surface of the board etc.

It is also provided that the method according to the invention comprises at least one step of determining all or part of the at least one digital document that is displayed by default and/or of the functional state of the board by default. This entails offering the possibility of imposing all or part of the at least one document which is displayed by default, and/or of the interfaces proposed to the users, for example by redisplaying one or several documents chosen beforehand by the administrator and/or by suitably rearranging the interaction mediums with the user after a time during which the board has not been used has elapsed since the last interaction with a user. As such the board according to the invention offers the dual advantage of allowing for the display of at least one document chosen by the user from possibly a large number of proposed documents while still also allowing the administrator in charge of operating the board to impose all or part of the displayed content and/or the function state of the board in the absence of any specific interaction with a user since a determined time.

It is provided that the method according to the invention further comprises at least one step of printing at least one hard copy and/or of transmitting a dematerialized version of the at least one selected digital document. This refining of the invention aims to provide to the user a print on paper of a document of interest that the user has selected, or the supply thereof in electronic form via the copy of a file, for example in the "Portable Document Format" (PDF) standard on a removable memory medium such as a USB key that can be connected to the electronic board, or by an electronic means such as an attachment to an email, by fax or any other equivalent means from a service rendered standpoint. It is also planned to send the document via mail after it is printed in a centralized remote printing site. For the physical or electronic sending of documents of interest, a step is provided so that the user enters on the electronic board, or via their telephone or smartphone, their mailing address, or email address, or fax number. It is also planned a step of identifying the user using any pertinent means that allows the system to know the address or the number required for conveying the document via a database that matches an identifier of the user and the required addressing information.

According to another aspect of the invention, the use of the method according to the invention is provided in order to make written information available to an audience in order to meet legal display obligations or regulations in places open to an audience for example in private companies for the use of persons that work there, in administrations for the use of persons that work there and in any type of public building for the use of citizens or private buildings for the use of persons who have access to it. This entails for example replacing conventional display boards with boards that are more attractive for the users which are in addition simpler to administer in places such as town halls, schools, unemployment offices, post offices etc. It also entails replacing conventional display boards in halls of residential or office buildings.

BRIEF DESCRIPTION OF THE DRAWINGS

Other advantages and characteristics of the invention shall appear when examining the detailed description of embodiments that are in no way limiting, and of the annexed drawings wherein.

DETAILED DESCRIPTION OF THE FIGURES AND EMBODIMENTS

Figure 1:
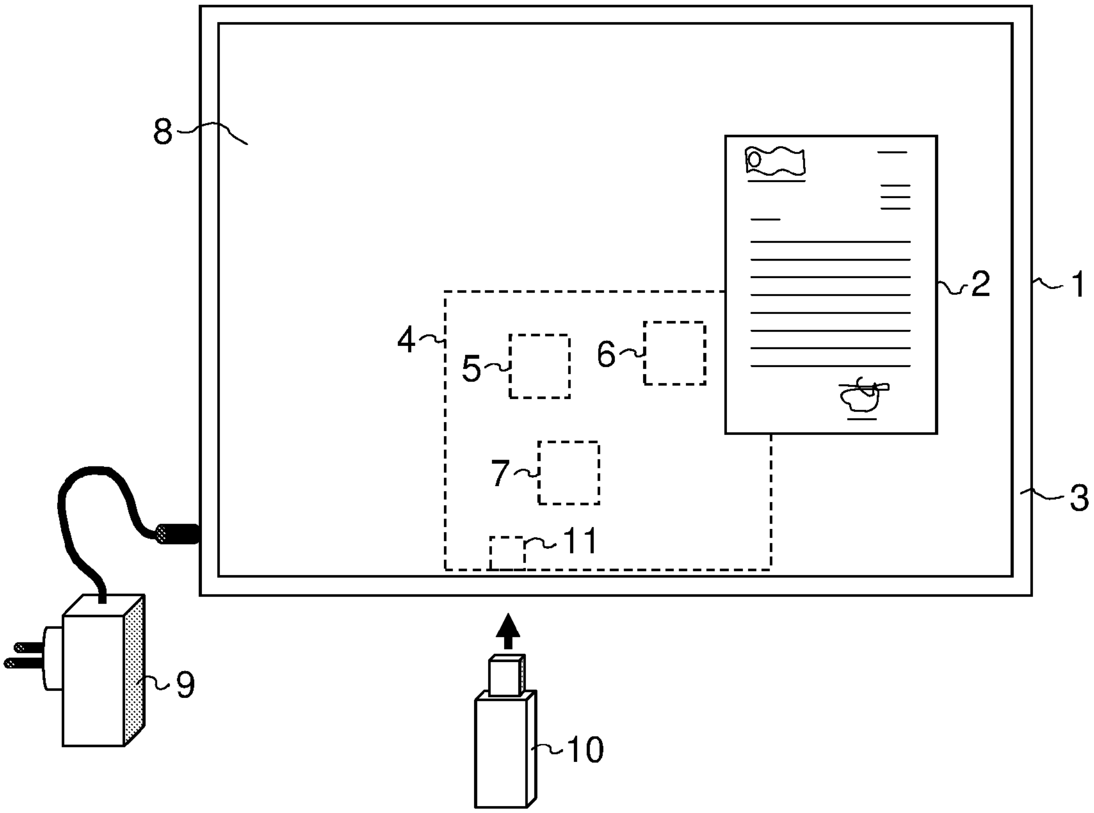
FIG. 1 shows a first alternative of the board according to the invention.

Other particularities and advantages of the invention shall further appear in the description hereinafter. In the annexed drawings provided by way of non-limiting examples:

FIG. 1 shows a first minimalistic alternative of the board according to the invention. Here there are the essential technical characteristics of the invention in the form of functional blocks separated for clarity of the description. As such there is in a casing 3 having a flat shape suited for a use of the board in vertical position, an information processing subassembly 4. This subassembly comprises a microprocessor 5, a memory 6 that can store at least temporarily an application program connected with the display of at least one digital content, a memory 7 able to store data connected with at least one digital content to be displayed. The board without this simplified alternative comprises a single display subassembly 8 and an electrical power source 9. It is provided to have the digital content to be displayed entered via a memory medium such as a memory card or a USB key 10 connected to the information processing subassembly via a suitable connector, for example a standard connector for a memory card or a USB base. In a first sub-alternative embodiment, the memory 10 that contains the digital content to be displayed remains connected as long as the digital content that it contains is rendered displayable or as long as it is effectively displayed on the board. In another sub-alternative, the content of the memory 10 is copied to an internal memory of the at least one information processing subassembly 4 before it is used by the board in such a way that the removable memory 10 is used only as a temporary means for transferring at least one displayable digital content from a computer or from a tablet to the electric board according to the invention. According to the sub-alternatives, it is provided that the content of the memory 10 is directly and automatically used by the board right from the connection thereof in the connector 11. It is also provided to offer choices to the user via a menu displayed temporarily by the board and by suitable means of selection. This example of a minimalist embodiment of the invention does not provide a clock of the real-time type in that it requires a setting of the time and of the date of the location and of the means in order to ensure the correctness of this information. It is provided that possible management of the display time for documents, whether for measuring the exposure time to the public of documents or for programming the duration thereof, is carried out by simply counting the relative time, and where applicable by comparing with instructions for the relative durations of display.

The scope of the invention is not left if all or part of the functional blocks identified hereinabove are integrated into the same electronic component and do not appear in the form of dedicated components that can be seen by the unaided eye on a printed circuit. It is indeed conventional in electronics to attempt to integrate a maximum of functions into the same component in order to reduce the costs of producing the device. The functional blocks integrated, which can no longer be identified by the unaided eye, are nevertheless present in the resulting highly integrated chip where applicable.

Figure 2:
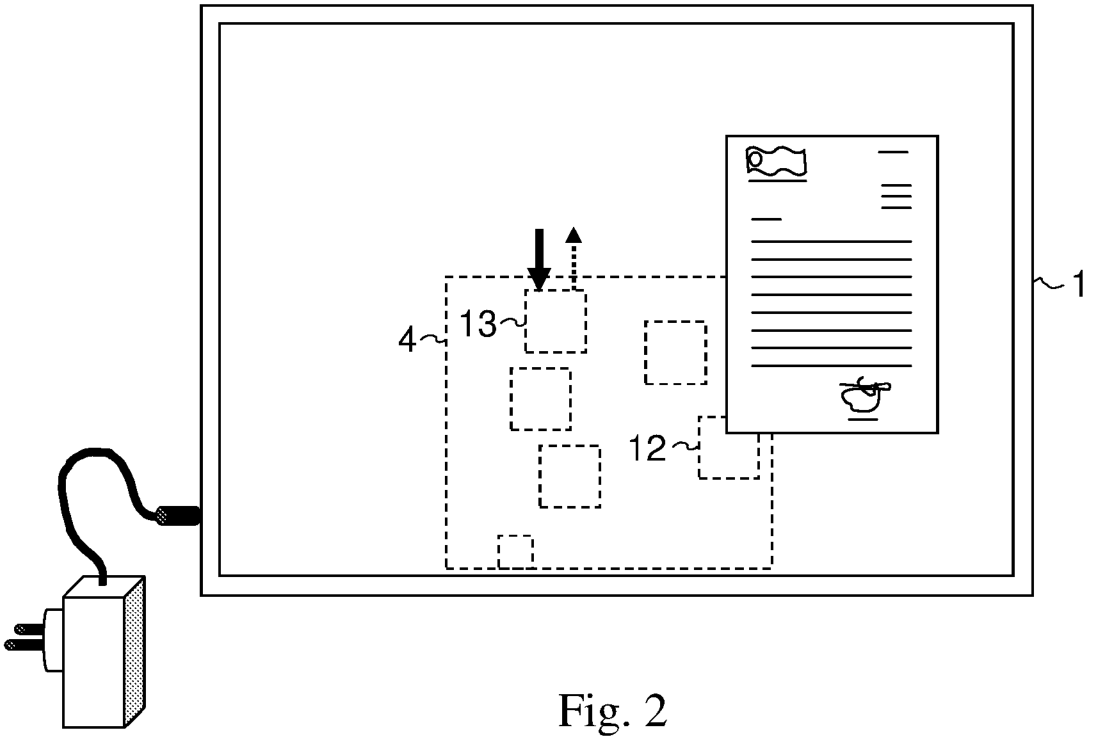
FIG. 2 shows a second alternative of the board according to the invention.

FIG. 2 shows a second alternative of the board according to the invention 1 which differs from that in FIG. 1 in that it comprises a real-time clock 12 and at least one communication channel 13. It is provided that the setting of the time and of the date is done via any pertinent means from a manual setting carried out by a user from a menu and suitable input means to an automatic setting via the capturing of radio time information, or transmitted via a network, or by a device external to the board to which it can be connected to at least occasionally such as for example a tablet, a smartphone or a computer. It is provided to ensure the permanence of the knowledge of the absolute time in the board via any means such as for example a power supply via battery, via a storage battery or super-capacitor of an electronic component dedicated to the function within the board, or via the automatic obtaining of the absolute time information from an outside source. The at least one communication channel 13 is at least one-way in that the at least one information processing subassembly concerned to receive the at least one digital content to be displayed. The means for receiving and/or for transmitting data of which it is a question are wired means such as an Ethernet connection which advantageously is also a source of energy of the so-called "PoE" type, for example according to the standard IEEE 802.3af, able to relieve the board from a source of energy connected to the electrical network. Of course any other means of wireless data transmission, one- or two-way, via electromagnetic waves, magnetic fields or by light rays is provided. Current means such as for example the connecting to a local network via WiFi and/or occasional connections via Bluetooth to a portable terminal are particularly suited for the use of the board according to the invention. A portable terminal of the smartphone, tablet or portable computer type can indeed not only be a source of digital content to be displayed on the board but also an excellent means to allow the users to interact with the electronic board via a standard web browser, with or without an additional plugin, or via an application that is specific to the board which is run by the terminal.

Figure 3:
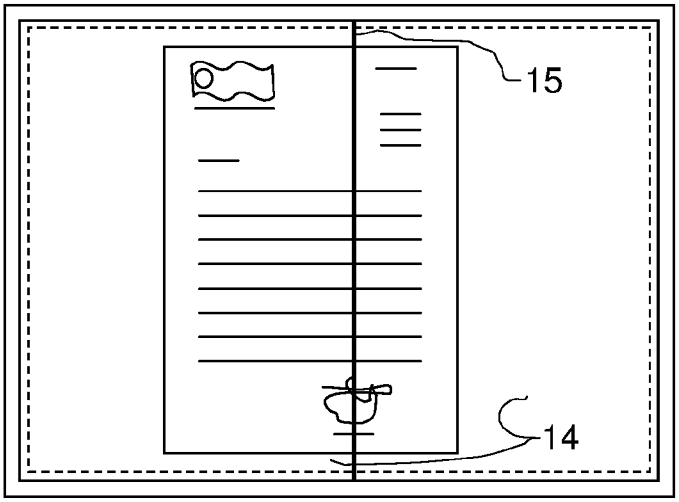
FIG. 3 shows a first alternative of a composite electronic screen.

FIG. 3 shows a first alternative of a composite electronic screen realized using two basic screens 14 juxtaposed on their respective edges 15 where the columns or the lines of active pixels arrive the closest. This alternative is suitable for display modules that include at least one privileged edge in the routing of the electrodes so that the last row of pixels is located as close as possible to the edge so as to reduce the width of the strip without pixels that separates the first rows of pixels of two display modules placed edge to edge. In such a case, it is provided that the software that manages the display of the composite screen formed as such distributes the information transmitted to each basic display module in order to produce a display over the entire surface comprised of two basic display surfaces as if it were a single screen that has the total display surface.

Figure 4:
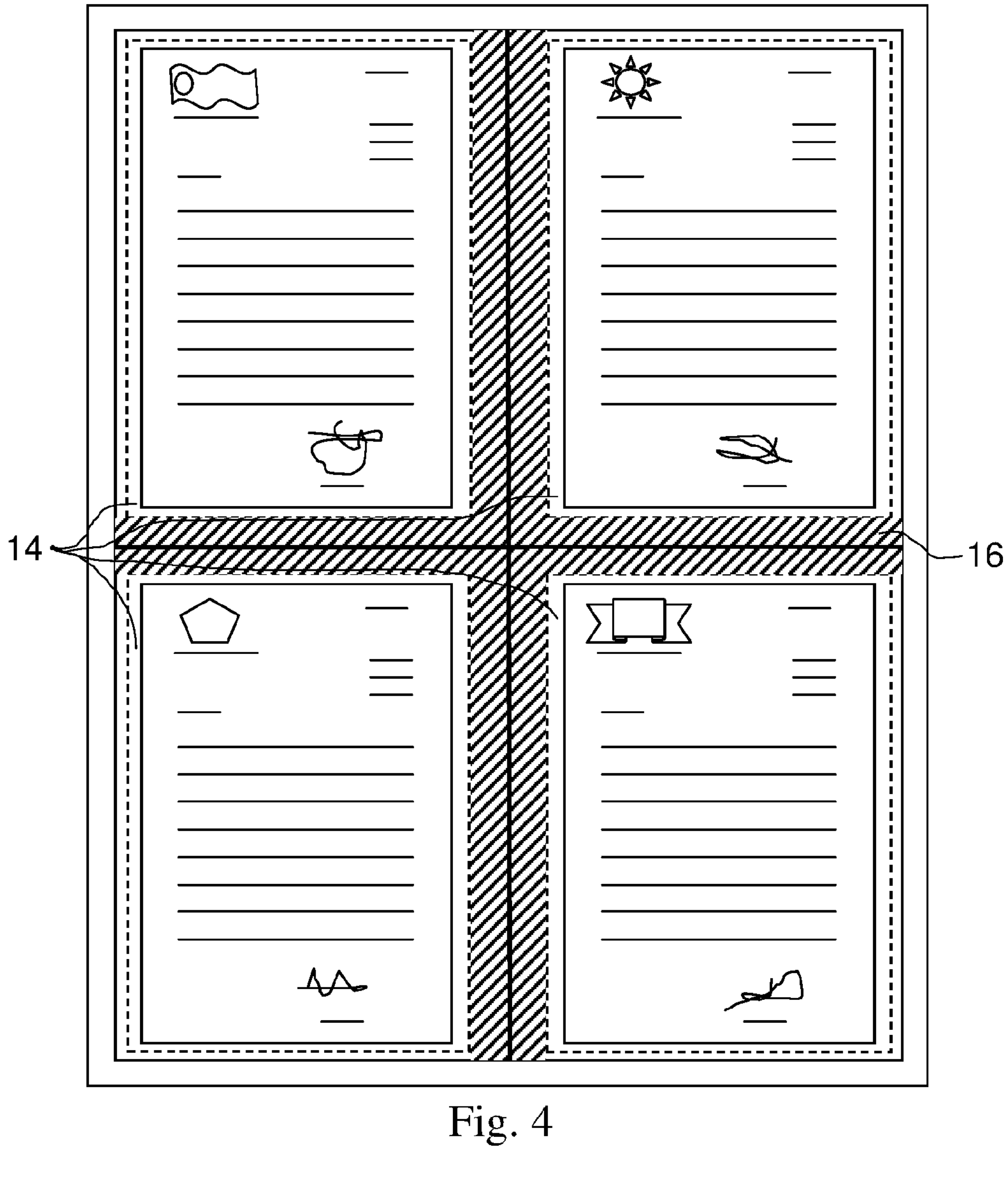
FIG. 4 shows a second alternative of a composite electronic screen.

FIG. 4 shows a second alternative of a composite electronic screen realized using four basic screens 14 which are not optimized to offer at least one edge close to a first row of active pixels. As such there is a space between the basic screens (the hashed surface 16) which is too large to be able to be distributed without losing readability of the display of the same graphic element forming a whole such as a document, over several basic screens. In such a case, it is provided that the software that manages the display of the composite screen formed as such distributes the information transmitted to each basic display module to fully display the same graphic element forming a whole on one of the basic display surfaces in such a way that the surface without pixels does not form a hindrance to readability and be in the end invisible.

Figure 5:
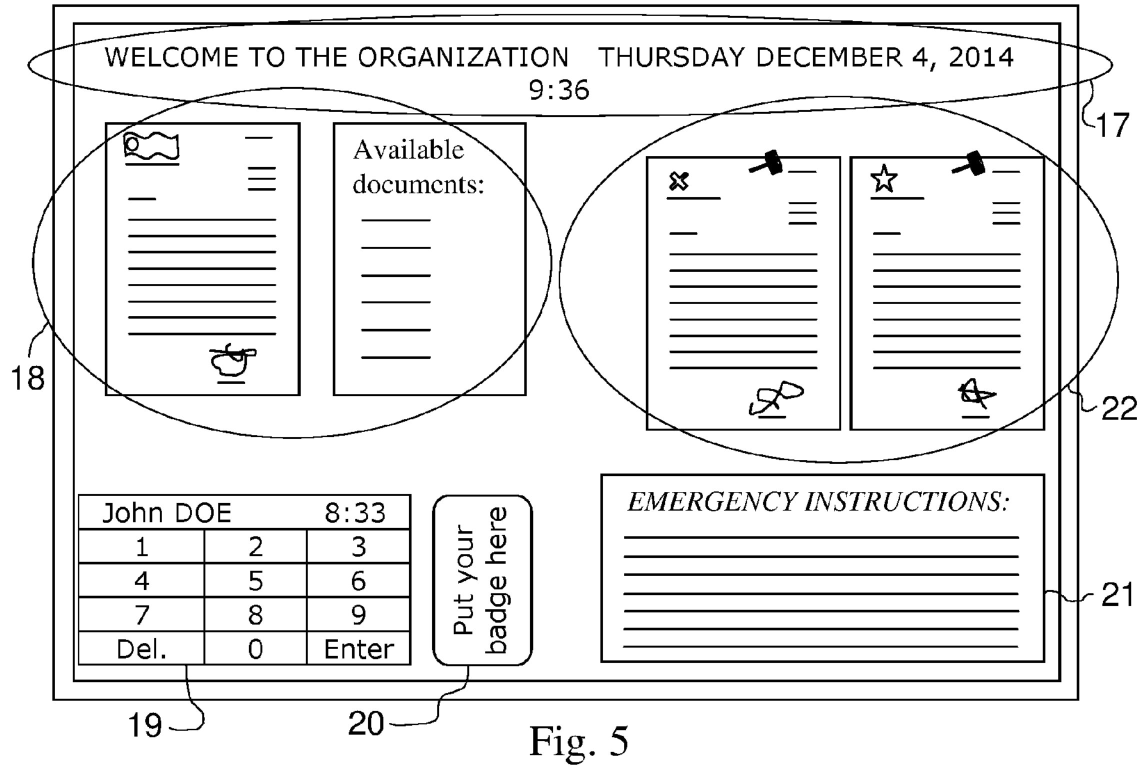
FIG. 5 shows an alternative of a composite display surface.

FIG. 5 shows an alternative of a composite display surface that comprises display subassemblies of a different nature forming the display surface of the board according to the invention. For example a display banner 17 using an emissive technology for example LCD with backlighting or OLED that can be seen from afar in order for example to display the time and the date and/or scrolling information, an electronic display surface for documents 18 with high, even very high, resolution that can be monochrome, of an emissive or passive nature, more preferably passive and bistable in order to reduce the electrical consumption. A tactile display surface 19 is dedicated to interactions with the users, it is advantageously supplemented by a zone 20 for the reading of a contactless smart badge, for example in order to meet the needs of managing work hours. This alternative also includes a printed display surface 21, for example by silkscreen on a support, for example a plastic material. The ink and the substrate can advantageously be sustainable and UV-resistant in order to display information that is not intended to change frequently during the operation of the board, for example safety instructions. A surface 22 dedicated to the display of documents printed on paper medium is also provided in order to offer a display solution for documents that are not available in digital form or in order to increase the global display surface of the board at a low marginal cost. As disclosed hereinabove it is provided that advantageously from a technical and/or economic standpoint, all of the specialized "zones" from a functional standpoint or all of the subassemblies mentioned hereinabove are manufactured in the form of dedicated modules that have a standard format in order to allow for easy composition and boards according to the invention that satisfy many functional or dimensional needs.

Figure 6:
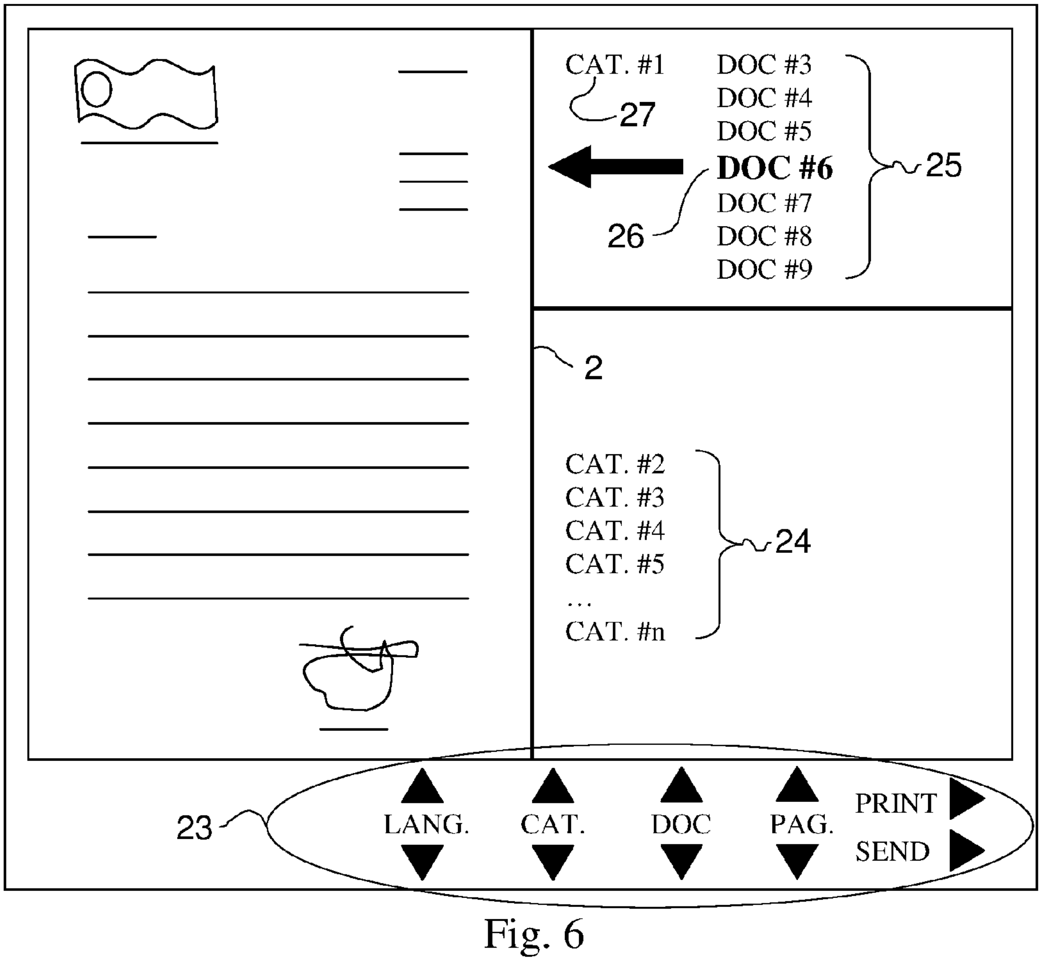
FIG. 6 shows an alternative ergonomics for the management of documents.

FIG. 6 shows an alternative ergonomics suited for the management of documents on a display surface comprised for example of two A4, B4 or C4 format screens or of a single screen respectively with the A3, B3 or C3 format. This alternative, which is in no way limiting, uses half of the display surface for the browsing in the space of displayable documents. The other half of the display surface is used for displaying the facsimile of the selected document 2. In this example, the choices of the user are made via buttons 23 located in the frame of the board. After having where applicable chosen the language of the interaction with the user and possibly the language in which the selected document is restored, choosing a document category is done by browsing in a first list 24 using dedicated buttons, for example in the case of a town hall, this involves choosing from building permits, civil status, the environment, decisions of the mayor etc. In each category, the available documents are displayed in a second list 25 within which the user can browse with dedicated buttons, the current document 26 of the current selection in the category 27 that was retained beforehand is displayed in the expected format 2 in the dedicated portion of the display surface. If the documents are comprised of several pages, dedicated buttons make it possible to browse through the pages.

Many other alternatives are provided for operating a tactile screen, allowing for searching and selecting documents on a smartphone or on a tablet connected to the board, the temporary display of browsing information superimposed or inserted into the image of the document, according to the possibilities of the screen technology used, in order to be able to reduce the display surface if necessary or in order to be able to display two pages at the same time.

Figure 7:
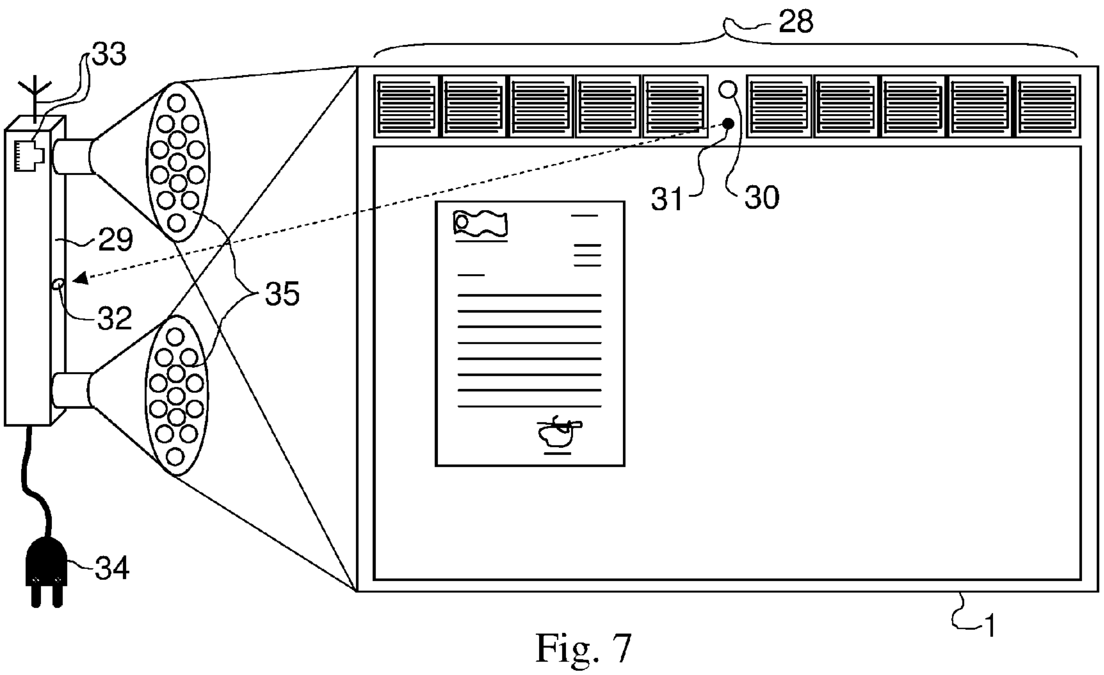
FIG. 7 shows an alternative board that uses light exclusively.

FIG. 7 shows an alternative board 1 that is physically disconnected from any wired network and which uses light exclusively for its supply with energy and for the communication with a data communication network. A banner located in the upper portion of the board comprises a surface covered with photovoltaic cells 28 which is dimensioned according to the lighting power density that can be received from the light emitter 29 and the electrical power needed to operate the board 1. A receiver 30 comprising for example a photodiode that is sensitive to the wavelengths emitted by the light emitter 29 captures the modulation of the light which is carried out using very short interruption times in order to not decrease the average lighting power emitted and with a recurrence of controlled interruptions so that the modulation is not perceptible by the human eye thanks to the persistence of vision. In certain alternatives, a two-way data connection is implemented by adding a signal emitter 31 in the board, for example based on at least one infrared LED, and a receiver 32 in the light emitter, with the emitter 31 and the receiver 32 being compatible in terms of wavelength and modulation.

The light emitter also provides the function of a gateway between a conventional wired or wireless network 33 and one- or two-way data transmission means that use light, whether or not visible, which allow for the connection with the board. The light emitter is also connected to a source of electrical energy 34 that powers the light sources 35 and the internal resources of the emitter 29. Of course the scope of the invention is not left if the data is not transmitted to the board by modulation of the lighting light but via an infrared emitter or via a low-power radio connection such as Bluetooth for example.

Figure 8:
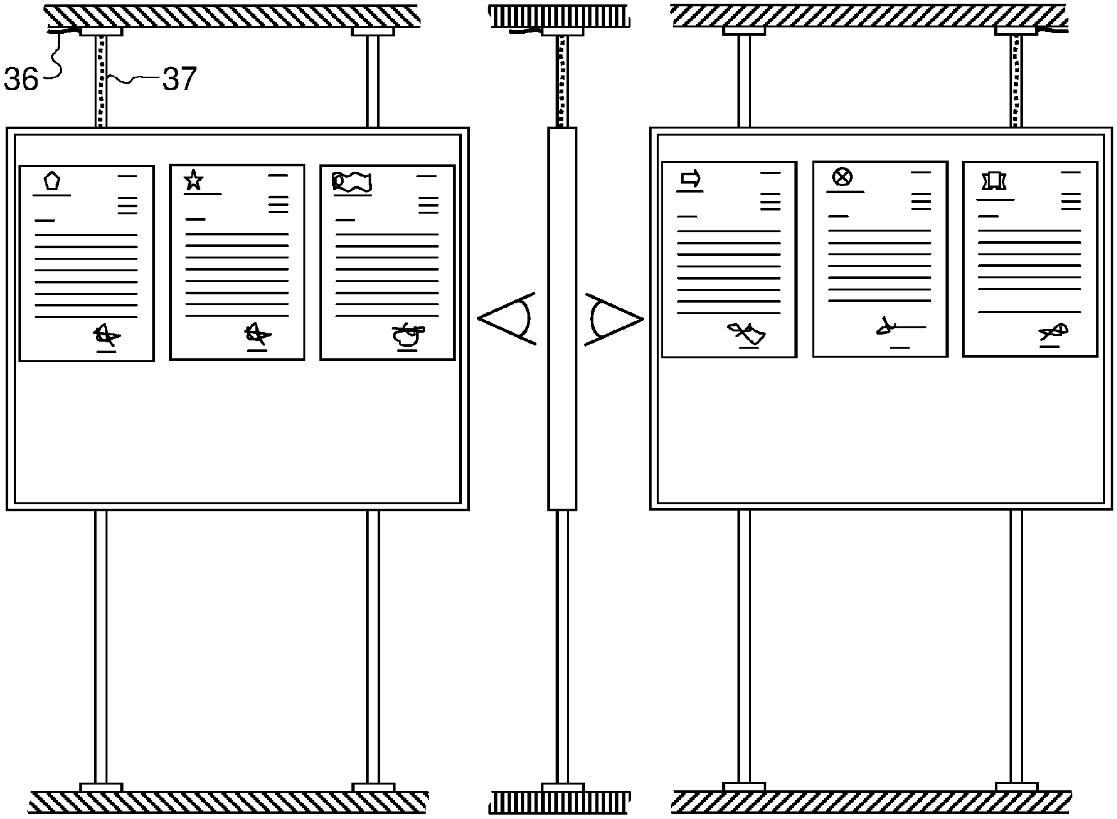
FIG. 8 shows an alternative board with a double-sided display.

FIG. 8 shows an alternative double-face display board. This entails in this alternative using the two faces of the electronic board according to the invention by physically positioning it in locations where it is installed so that the public can see its two faces. Typically the board is installed between the floor and the ceiling in such a way that the fastening is safe and rigid so that the board does not move and that the safety of the users is ensured. The scope of the invention however is not left if the board is only suspended from the ceiling, from a beam or a post or only fixed to the floor on suitable legs. Any physical connections 36 to the electrical power supply network and/or to a wired communication network advantageously pass in at least one of the fastening means 37. According to the alternatives, the second face of the board according to the invention is of the same nature, even an exact copy of the main face. In other alternatives, the second face implements for example different display means such as at least one screen allowing for the viewing of videos in color.

Figure 9:
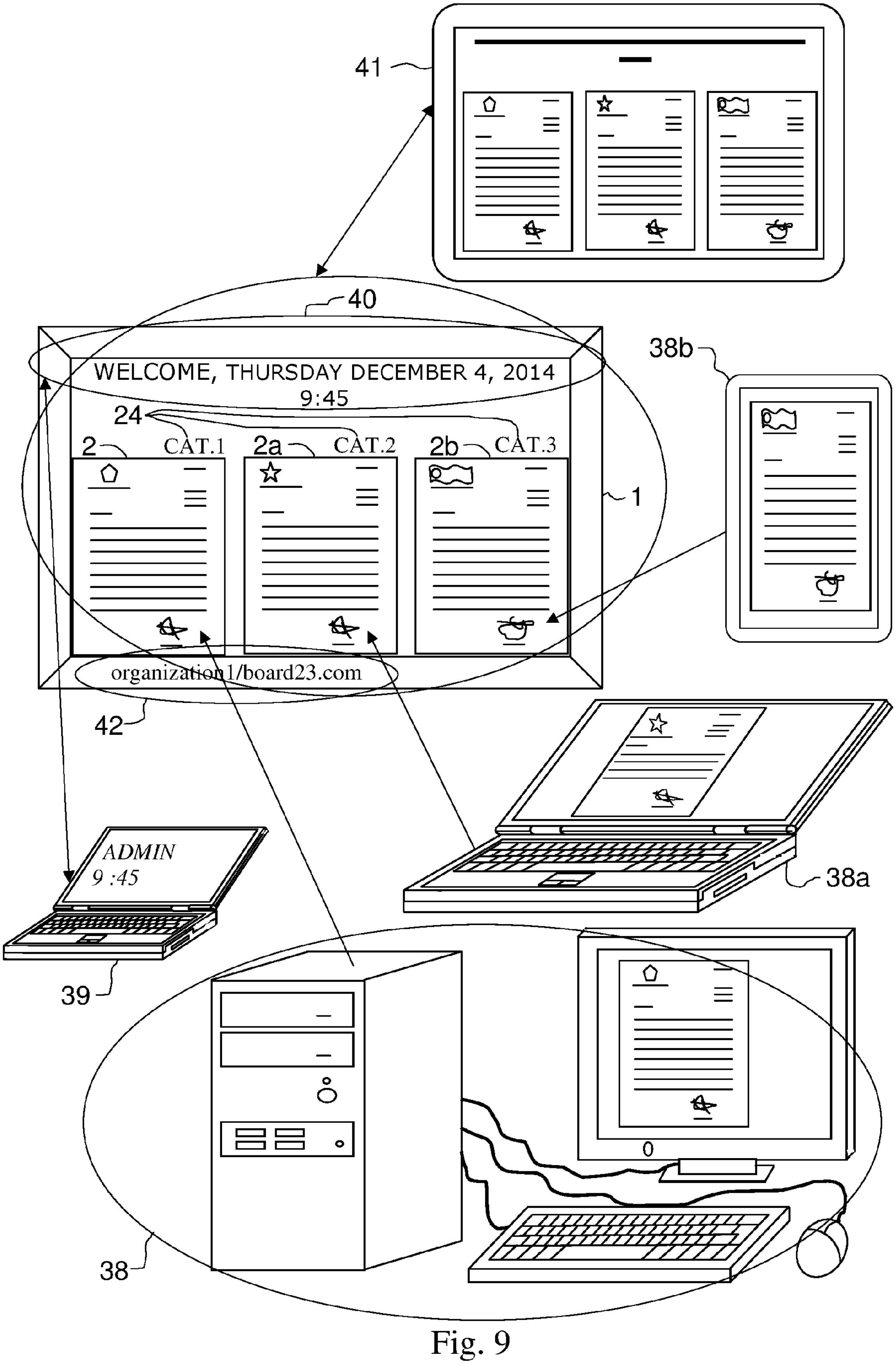
FIG. 9 shows a first alternative of the system according to the invention.

FIG. 9 shows a first alternative of the system according to the invention. In this example, the electronic display board 1 is the place of convergence where the targeted public can become aware of the information produced by the various independent entities and possibly separated from one another. The invention gives technical means to each one of the entities involved for publishing their documents entirely independently. It is also planned in certain alternatives that a third party entity validates a proposed document so that it be effectively published on the board. As such for example, each department responsible for producing documents 2, 2*a*, 2*b* belonging to given categories 24, of which the name is displayed for the comprehension of the reader, directly publishes in the space that is allocated to it on the board 1 its documents from its workstation, respectively 38, 38*a*, 38*b*. For example, via a web address dedicated to each space of the board, the contributor concerned accesses the space of the board that is allocated to it using a standard web browser on his workstation, from his residence or while travelling. An administrator is in charge of configuring the board that he manages also remotely from his workstation 39, or using a tablet or a smartphone that can connect directly to the board via Bluetooth or WiFi for example. The administrator of the board defines for example the general information displayed 40, the spaces allocated on the board to each authorized contributor, the identifiers and the passwords, the web addresses for access and the information of the category 24 type displayed etc. The administrator also has access to setting the time and the date, to statistics on for example the duration of exposure to the public of each document, the numbers and the timestamps of the consulting etc. This example also implements a web server function that consolidates all of the displayed and/or displayable information on the board 1 and makes it available remotely to users on a standard terminal 41 via a web address that is dedicated to the board 42 which the public involved is made aware of. According to the alternatives, the web address of the board is displayed on the at least one display surface and thanks to this can be easily modified by the administrator but this constant information occupies the display surface which may be more useful for other information which is why certain alternatives opt for example for mentioning the web address on a label affixed to the frame of the board or on a panel, or on another printed display zone, or on a dedicated low-cost alphanumeric display which is integrated into the frame of the board. In certain alternatives of the invention, the web server function, preferably of which multiple instances can exist, is built into the board. It is however preferred to offset the running of web servers intended for users on remote machines in order to increase the number of simultaneous consultations at least cost and with the least energy consumption for the board according to the invention.

Figure 10:
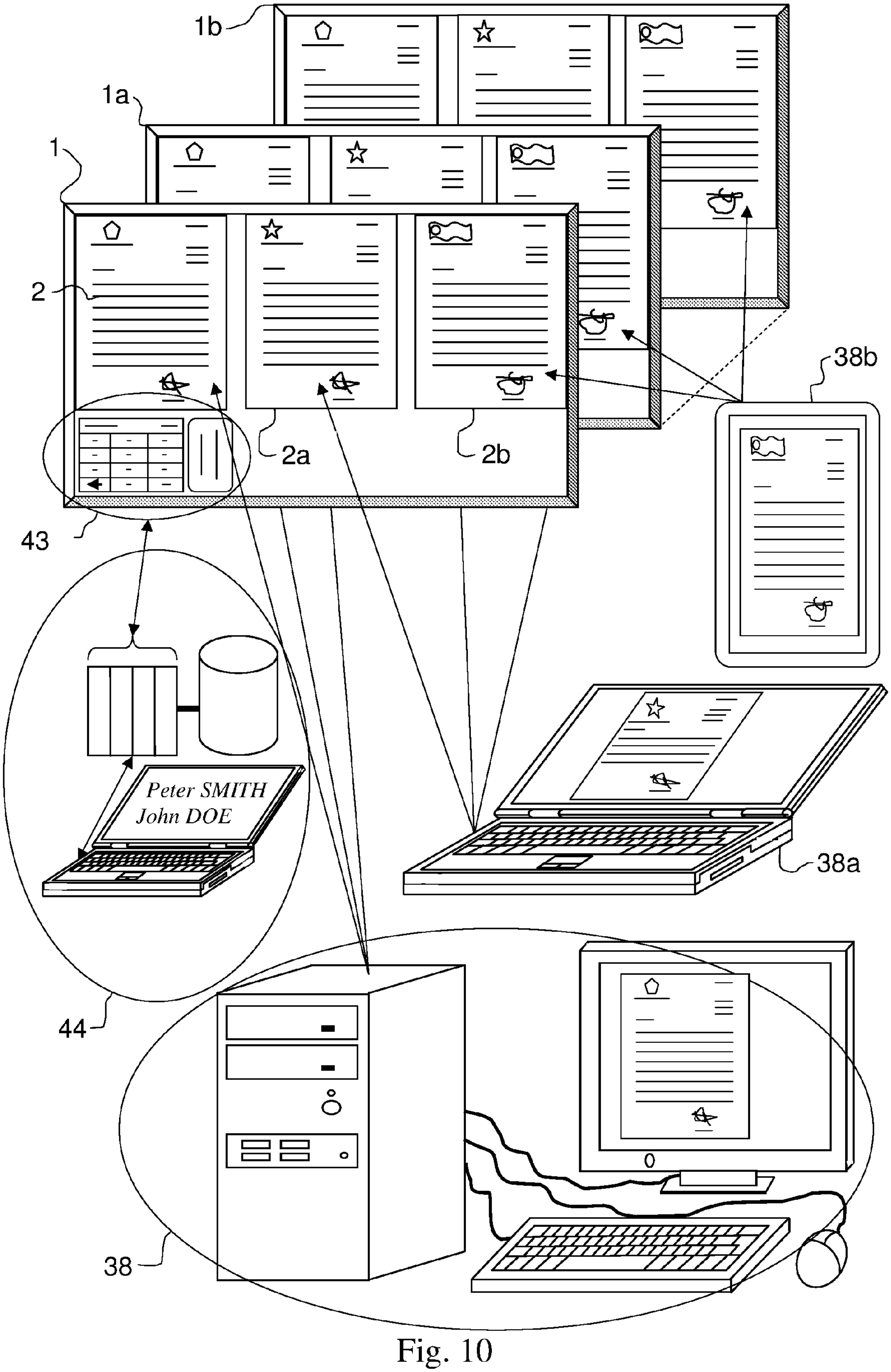
FIG. 10 shows a second alternative of the system according to the invention.

FIG. 10 shows a second alternative of the system according to the invention involving a plurality of electronic display boards 1, 1*a*, 1*b*. This embodiment of the invention represents a case of use in a company where several sites have the obligation to make boards available to the personnel in order to inform them of legal or regulatory information. Advantageously these boards are placed in locations of buildings where they can be consulted easily, typically in required areas of passage such as access points, entrance halls etc. The exposure frequency of the personnel to the information displayed is further increased when the board integrates functions and/or information that is required or of particular interest such as access control and/or working time 43, the company cafeteria menus, information proposing privileged conditions to the personnel for accessing goods and services etc. In this example, the personnel department directly manages the functions and the services that concern it. For example a person in charge of payroll administers the working time management functions 43 built into the boards via a suitable connection between the board and the information system concerned 44. Another person, from the legal department, publishes the information 2 that they are responsible for from their workstation 38. Another person responsible for another area, publishes and administers the documents 2*a* that concern them on their workstation 38*a*, a labor union publishes and administers its documents 2*b* via one of its terminals 38*b* from its premises etc.

Figure 11:
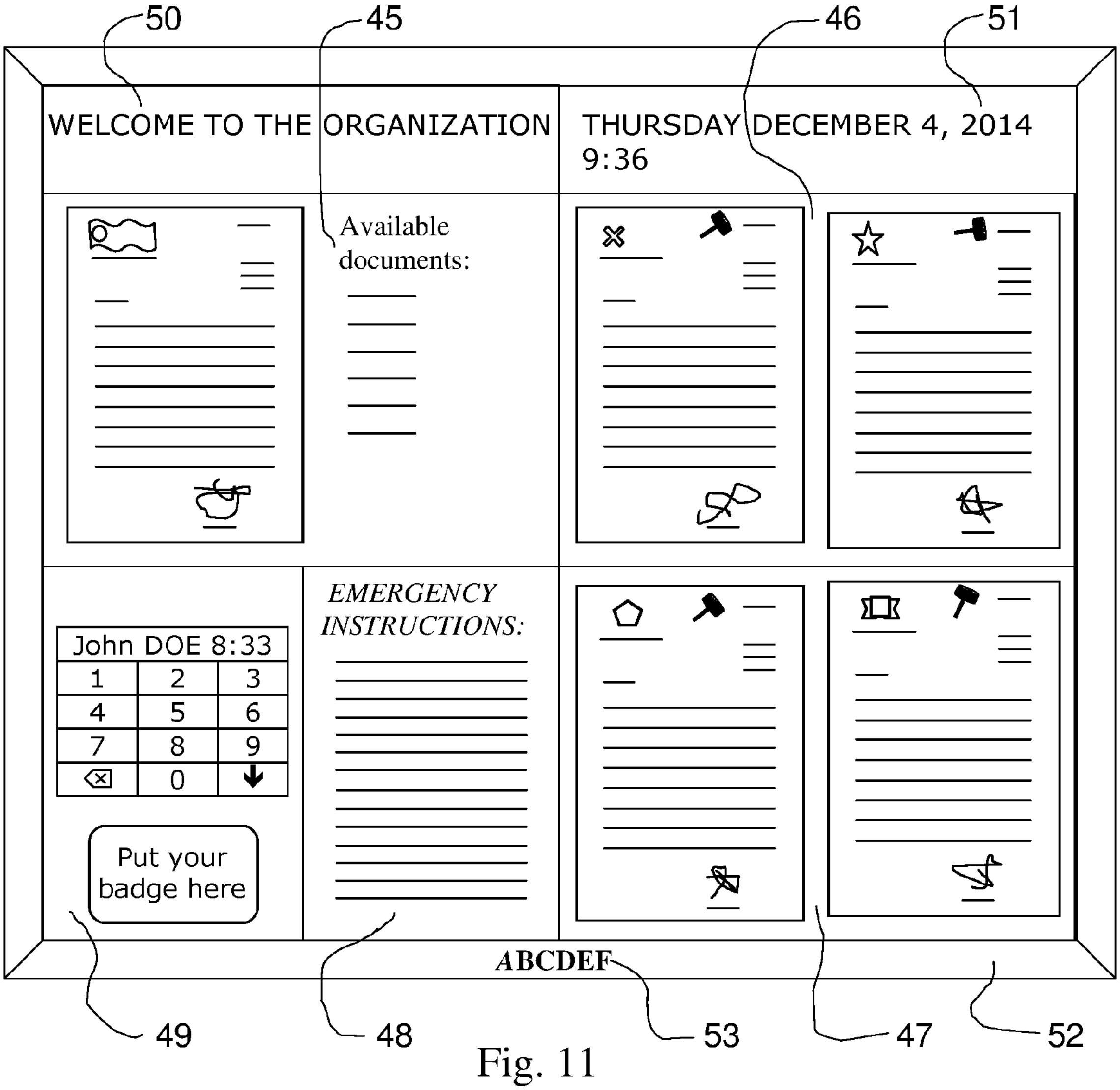
FIG. 11 shows a first alternative of a modular board.

FIG. 11 shows a first alternative of a modular board comprised using the following modules: a module 45 with C3 format that is ideal for displaying A4 documents on a scale of 1, comprising a high-resolution bistable tactile electronic display subassembly; two modules 46, 47 with C3 format which are appropriate for displaying printed A4 format papers; a module 48 with C4 format for displaying a silkscreen print; a module 49 with C4 format for managing work times, two display modules 50, 51 that can be seen from a long distance in the format of a banner of which the length is equal to that of a C3 module in landscape format and of which the height is specific; a frame 52 for the lateral mechanical protection of the modules of the board, for the hardware support for the aesthetics of the product and for displaying the commercial brand 53.

Figure 12:
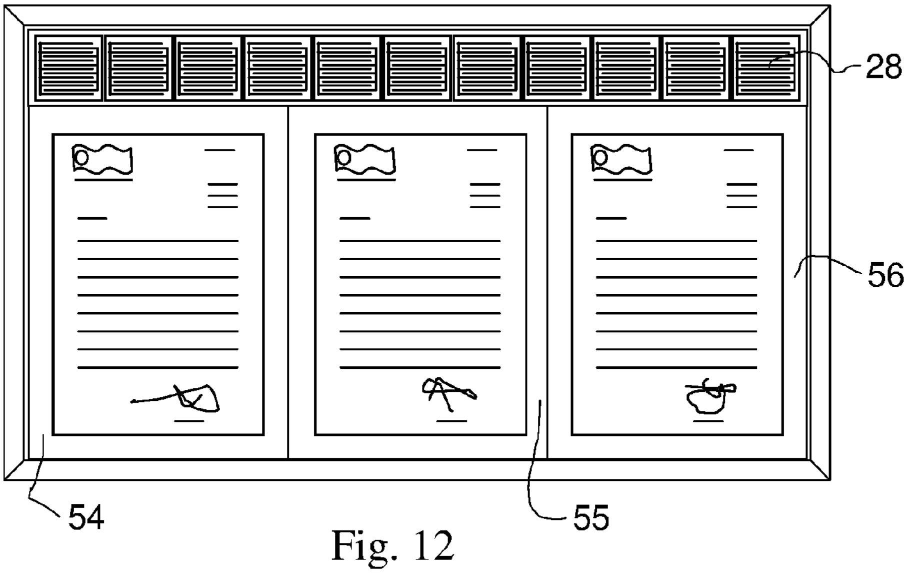
FIG. 12 shows a second alternative of a modular board.

FIG. 12 shows a second alternative of a modular board comprised using the following modules: three modules 54, 55, 56 with A4 format with a portrait orientation comprising a high-resolution bistable tactile electronic display subassembly; a photovoltaic power supply module 28 of which the length is equal to three widths of the A4 module with portrait orientation and for which the height is specific.

Of course, the invention is not limited to the examples that have just been described and many arrangements can be made without leaving the scope of the invention, in particular by combining several alternatives or by combining elements taken in several examples differently.

The invention claimed is:

1. Electronic display board (1) to enable a plurality of people to take cognizance of at least one displayable item of information (2) available in digital form in order to meet legal display obligations, or regulations in places open to an audience in private companies, in administrations and in all types of public or private buildings, the display board comprising:

A casing (3) having a flat shape suitable for use as a display board and configured to
- i) be used in vertical position, and
- ii) to receive functional components;

at least one information processing subassembly (4) comprising
- i) at least one microprocessor (5), and
- ii) at least one memory (6) able to store at least temporarily an application program operatively connected with the display of at least one digital content, and
- iii) at least one memory (7) able to store data operatively connected with at least one digital content to be displayed, and
- iv) at least one functional block consisting of software or hardware, or combination of hardware and software configured to manage rights associated with all or part of the information displayed or to be displayed;

at least one electronic display subassembly (8); and at least one electrical power source (9) used at least temporarily.

2. Electronic display board of claim 1, wherein the at least one electrical power source captures the energy (28) required to operate said board in its environment (29) in order to allow for operation that is disconnected from any wired network.

3. Electronic display board of claim 1, wherein, the at least one information processing subassembly further comprises at least one of the group of functional blocks consisting of software or hardware, or combination of hardware and software configured to
- i) provide time information,
- ii) receive rights data associated with all or part of the information displayed or to be displayed,
- iii) store rights data associated with all or part of the information displayed or to be displayed,
- iv) force the reinitialization of the at least one information processing subassembly,
- v) allow the user to interact with the board without touching the display surface,
- vi) choose the language in which at least one portion of the information displayed is presented to the reader,
- vii) orally restore at least one portion of the information displayed in the display language, viii) orally restore at least one portion of the information displayed in a different language,
ix) receive data,
x) transmit data,
xi) form a meshed network,
xii) decrypt the information transmitted by a remote source of information,
xiii) authenticate the source of the information received,
xiv) manage the working time of the personnel,
xv) selectively display information according to the identity or the category of the reader,
xvi) cooperate with a technical management system of the building,
xvii) cooperate with an external information system,
xviii) detect the presence of persons in a situation to view at least one item of information displayed,
xix) recognize at least one characteristic of persons in a situation to view at least one item of information displayed,
xx) identify persons who are viewing a content,
xxi) geo-locate the electronic display board,
xxii) address the electronic display board according to the location where it is physically installed,
xxiii) produce statistics or audience measurements,
xxiv) detect violations to the physical integrity of the electronic display board,
xxv) detect intrusions in the premises where the electronic display board is installed,
xxvi) generate a local acoustical alarm,
xxvii) transmit an alarm to a remote system,
xxviii) provide at least one web server function associated with at least one determined web address,
xxix) allow remote users to view all or part of the information displayed on the electronic display board,
xxx) allow remote users to view printed information displayed on the electronic display board by using a camera turned towards a face of the board.

4. Electronic display board of claim 1, wherein, the at least one information processing subassembly is one of the group consisting of a digital tablet, a phablet, a smartphone, an e-reader, a modular computer or an essential technical subassembly of such a device.

5. Electronic display board of claim 1, further comprising at least one of the group consisting of
i) a surface for displaying printed documents,
ii) a tactile restitution interface of at least one portion of the information displayed,
iii) a sensor,
iv) a video camera,
v) a digital camera.

6. Electronic display board of claim 1, wherein the at least one display subassembly is comprised of at least two basic display subassemblies juxtaposed edge to edge over at least one of their respective sides forming a global display subassembly with a surface equal to the sum of the surfaces of the at least two basic display subassemblies.

7. Electronic display board of claim 1, wherein the at least one electronic display subassembly is tactile.

8. Electronic display board of claim 1, wherein the at least one electronic display makes it possible to display all or a portion of said information in a persistent manner in the absence of a supply of electrical energy.

9. Electronic display board of claim 1, wherein the display board is arranged to display information coming from separate sources in dedicated display zones.

10. Electronic display board of claim 9, wherein each display zone dedicated to a given source of information is managed as a standard display for the remote information system that sends the information to it.

11. Electronic display board of claim 1, wherein said rights associated with all or part of the information displayed or to be displayed comprise at least one information of the group consisting of
i) the date of publication of an item of information,
ii) the duration for which an item of information must remain displayed,
iii) the date on which the display of an item of information must stop,
iv) a categorizing of the information to be displayed according to its content,
v) a categorizing of the information to be displayed according to the issuer thereof.

12. Electronic display board of claim 1, further comprising at least one display surface on its rear face able to allow for the use of the two main surfaces of the board.

13. Electronic display board of claim 1, wherein said casing is arranged to
i) obtain several functional combinations for a given board dimension by combining standardized basic technical subassemblies,
ii) obtain several board dimensions by combining standardized basic technical subassemblies.

14. System for displaying dematerialized information on an electronic display board in order to meet legal display obligations, or regulations in places open to an audience in private companies, in administrations and in all types of public or private buildings, the system comprising:
at least one electronic display board comprising at least one functional block consisting of software or hardware, or combination of hardware and software configured to
i) connect operatively to a data communication network,
ii) manage rights associated with all or part of the information displayed or to be displayed,
at least one server configured to
i) connect operatively to a data communication network,
ii) manage dematerialized information to be displayed,
iii) manage rights associated with the publication of dematerialized information on at least one electronic display board,
at least one network able to allow for data communication between the components of the system.

15. System of claim 14 further comprising at least one terminal executing a software being one of the group consisting of
i) a standard web browser,
ii) a "plugin" installed in a standard web browser,
iii) a dedicated application,
for at least one purpose of the group consisting of
i) managing the dematerialized information to be displayed,
ii) managing the rights associated with their publication thereof,
iii) administrating the operation of at least one electronic display board,
iv) viewing remotely all or part of the information displayed on the electronic display board.

16. Method for making written information available to an audience in order to meet legal display obligations, or regulations in places open to an audience in private companies, in administrations and in all types of public or private buildings, the method comprising steps of:

i) selecting at least one digital document proposed in a set of at least one displayable digital document, ii) displaying the at least one selected digital document on at least one electronic display board which contains means for managing rights associated with all or part of the information displayed or to be displayed.

17. Method of claim 16 further comprising at least one step of the group consisting of i) determining all or part of the at least one digital document that is displayed by default, ii) determining all or part of the functional state by default of the electronic display board, iii) printing at least one hard copy of the at least one selected digital document, iv) transmitting a dematerialized version of the at least one selected digital document, v) requesting the sending of the at least one selected digital document via mail after it is printed in a centralized remote printing site.

* * * * *